United States Patent [19]
Machado

[11] Patent Number: 5,675,121
[45] Date of Patent: Oct. 7, 1997

[54] PRECISION GRAPHICS FOIL HEADER

[75] Inventor: Russell L. Machado, San Diego, Calif.

[73] Assignee: Pulse Engineering, Inc., San Diego, Calif.

[21] Appl. No.: 439,223

[22] Filed: Jun. 5, 1995

[51] Int. Cl.⁶ .................................................. H05K 5/00
[52] U.S. Cl. ........................ 174/52.1; 174/138 R; 336/65
[58] Field of Search ........................... 174/52.1, 138 G, 174/138 R, 135; 336/65, 192; 361/821, 807

[56] References Cited

U.S. PATENT DOCUMENTS

| | | | |
|---|---|---|---|
| 4,363,014 | 12/1982 | Leach et al. | 336/90 |
| 5,452,183 | 9/1995 | Renn et al. | 361/789 |
| 5,520,551 | 5/1996 | Broschard, III | 439/567 |

Primary Examiner—Kristine L. Kincaid
Assistant Examiner—Kristina Soderquist
Attorney, Agent, or Firm—Baker, Maxham, Jester & Meador

[57] ABSTRACT

An electronic component mounting holder for surface mounting of an electronic component having a plurality of tape leads, includes a non-conducting three dimensional rectangular frame having vertical peripheral walls formed of nonconducting material for receiving an electronic component having a plurality of tape leads, the peripheral walls having a top peripheral edge and a bottom peripheral edge, a support ledge extending inward from inner surface of said peripheral wall for supporting an electrical component, a coil formed of foil windings having leads formed by extensions of said foil windings, a plurality of tape lead receiving areas formed in at least two sides of said bottom peripheral edge, said receiving areas each positioning a tape lead for surface bonding to a conductor on a PC board, a plurality of lead receiving recesses formed in corresponding sides of said top peripheral edge for receiving an outermost end of a tape lead, and a retainer for mounting in engagement with latch means in said frame for retaining the electrical component and said outermost ends of said tape lead in said cavity.

19 Claims, 1 Drawing Sheet

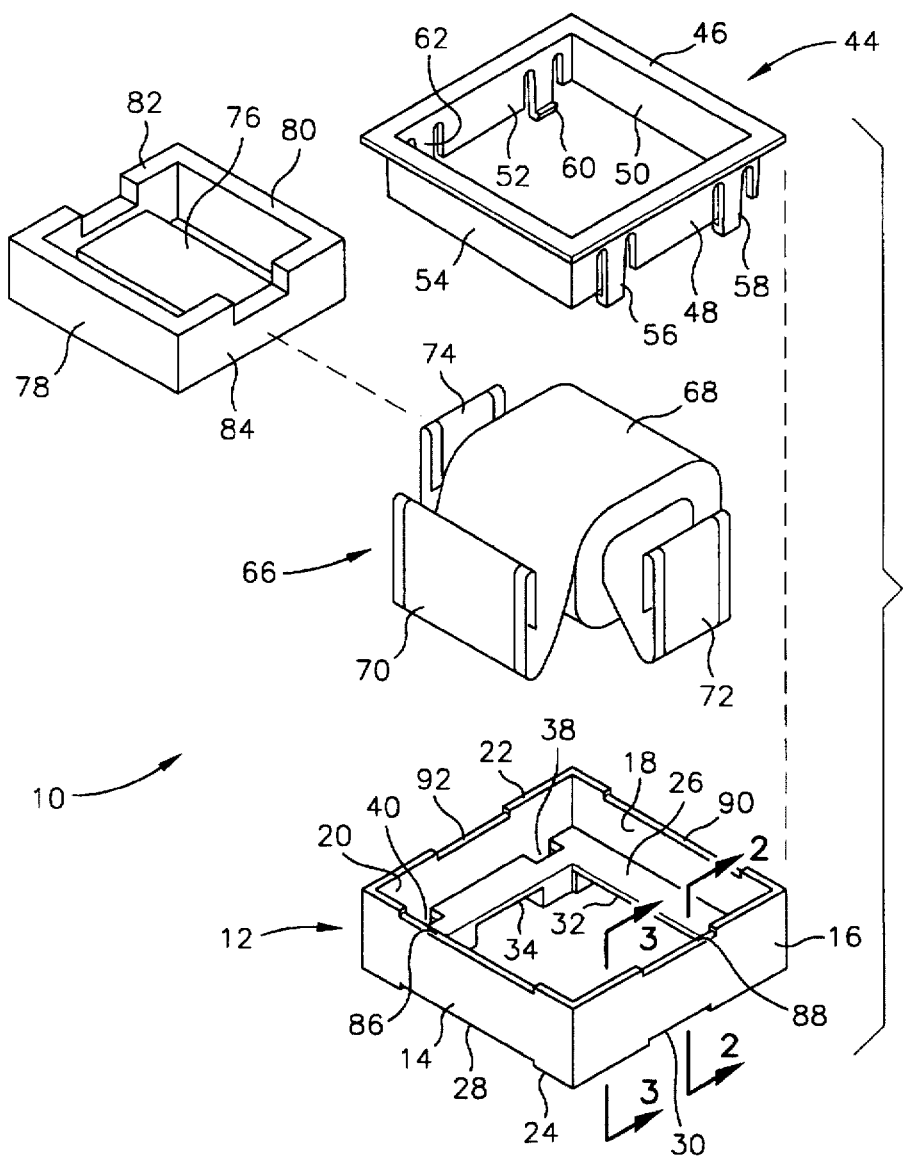
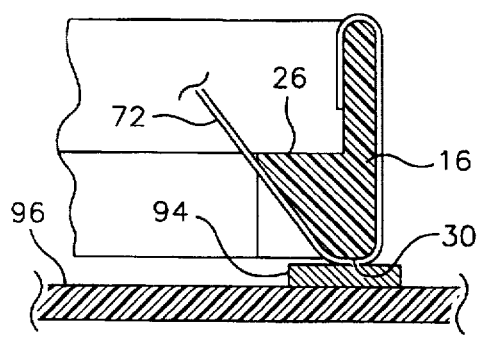
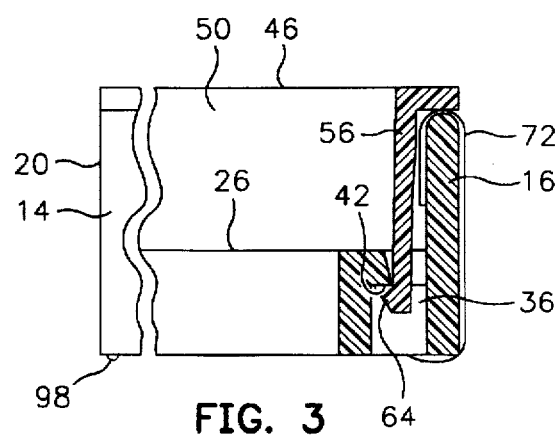
FIG. 1
FIG. 2
FIG. 3

PRECISION GRAPHICS FOIL HEADER

BACKGROUND OF THE INVENTION

The present invention relates to surface mounting of electronic components and pertains particularly to improved headers for foil leads.

For many years, electronic circuit boards have been fabricated by interconnecting a plurality of electronic components, both active and passive, on a planar printed circuit board. Typically, this printed circuit board has comprised an Epoxy/fiberglass laminate substrate clad with a sheet of copper, which has been etched to delineate the conductive paths. Holes were drilled through terminal portions of the conductive paths for receiving electronic component leads, which were subsequently soldered thereto.

More recently, so-called surface mount technology has evolved to permit more efficient automatic mass production of circuit boards with higher component densities. With this approach, certain packaged components include lead frames forming terminals supported by headers to which leads are connected. Headers are the part of a sealed component or assembly that provides support and insulation for leads passing through the walls. The packaged components are mechanically placed by assembly equipment at preselected locations on top of a printed circuit board, so that their terminals are registered with, and lie on top of corresponding solder paths or pads. The printed circuit board is then processed by exposure to infrared or vapor phase soldering techniques to re-flow the solder, and thereby establish a permanent electrical connection between the leads and their corresponding conductive paths on the printed circuit board.

The increasing miniaturization of electrical and electronic elements and high density mounting thereof has created increasing problems with electrical isolation and mechanical interconnection. The recent increased use of foil wound coils has further compounded these problems. In particular, it creates more difficulty establishing reliable and efficient connection between packaged components and egress hardware or terminals.

Among the foil wound electrical and electronic elements that must be surface mounted on PC boards are coils, such as foil wound cores used as inductors and transformers or other such components in circuits. These are preferably connected through some form of header of the packaging with suitable terminals. Recent developments in these coils has led to wider use and the need for improved headers to be used with precision graphics foils.

It is, therefore, desirable that an improved packaging with improved headers and lead form for termination and mounting of electronic components be available.

SUMMARY AND OBJECTS OF THE INVENTION

It is the primary object of the present invention to provide an improved package with improved header and lead form and method of mounting of electrical components.

In accordance with a primary aspect of the present invention, an electronic circuit package for a device having a plurality of leads comprises a three dimensional holder of a non-conducting material having a cavity therein for holding a circuit element, a plurality of lead terminal mounts on the base of the holder, and each lead terminal mount having a conductive path and a lead gripping slot for receiving and holding a lead in conductive relation with the path.

BRIEF DESCRIPTION OF THE PREFERRED EMBODIMENTS

The above and other objects and advantages of the present invention will become apparent from the following description when read in conjunction with the accompanying drawings wherein:

FIG. 1 is an exploded perspective assembly view illustrating details of a preferred embodiment of the invention;

FIG. 2 is a detailed partial side elevation view in section taken generally on line 2—2 of FIG. 1 assembled; and FIG. 3 is a view like FIG. 2 taken generally on line 3—3 of FIG. 1.

DETAILED DESCRIPTION OF THE PREFERRED EMBODIMENTS

Referring to FIG. 1 of the drawing, there is illustrated a holder assembly including a coil in accordance with a preferred embodiment of the present invention designated generally by the numeral 10. The holder comprises a three-dimensional body designated generally at 12 of a non-conducting material having a generally rectangular open frame configuration with four sides walls 14, 16, 18 and 20 forming a vertical peripheral wall, a top peripheral surface 22, and a bottom peripheral surface 24. A support ledge 26 is formed integral with and extends inward from the inner surface of the peripheral wall, as illustrated for supporting an electrical or electronic component. The holder is designed with headers for mounting electrical component having foil or tape leads for surface mounting on printed circuit boards.

As shown in FIG. 1 of the drawing, an exploded assembly view of an electrical component mounting holder having surface mounting headers is illustrated and designated generally by the numeral 10. The holder itself designated generally by the numeral 12, comprises a generally rectangular open frame-type structure having four vertical walls 14, 16, 18 and 20, joined together forming a peripheral enclosure having a top peripheral edge 22 and a bottom peripheral edge 24. The holder is provided with support means on the inside of the peripheral walls in the form of a peripheral ledge 26 having a horizontal upper surface extending inward from the inside of the vertical peripheral walls.

The bottom peripheral surface of the holder is provided at each of the respective sides with tape lead receiving areas, which are formed as shown in FIG. 2 at 30 with a rounded portion and an upwardly sloping recess extending upward from the underside of the respective sides of the support member 26. This accommodates tape leads as will be more fully discussed hereinafter. The holder is formed with latch pin receiving recesses 36, as shown in FIG. 3, and at 38 and 40 as shown in FIG. 1. Each of the sockets includes a latch shoulder only one of which is shown at 42 in FIG. 3.

A retainer designated generally at 44 comprises a generally open peripheral frame with a rectangular configuration having an upper radially outwardly extending peripheral flange 46 and downwardly depending vertical walls 48, 50, 52 and 54, sized to fit just inside the vertical walls of the holder body 12. The two side walls 48 and 52 of the frame 44 are provided with latch fingers 56, 58, 60 and 62 for fitting into the latch sockets 36, 38 and 40 in the holder. The latch finger 56, as shown in FIG. 3, has a latch hook 64 that hooks under shoulder 42 in the latch slot or opening 36. The latching of the retainer holds it into place and holds the electrical or electronic component in the holder body 12.

The holder is designed to receive tape or foil wound cores or coils forming transformers, choke coils or other coil components. As shown in FIG. 1 a coil designated generally by the numeral 66 is wound of tape or foil conductors forming a coil 68. The coil is made up of a conductive tape or foil of copper carried on a insulated backing of a suitable plastic material. The coil is made up of a conductive circuit of leads made by a photoetching or similar process wherein conductive traces are formed on the laminate with lead terminals 70, 72 and 74, extending outward from selected sides of the main inner coil 68. The coil is wound on a center section 76 of a core with side pieces 78 and 80 extending around the outside and connected at ends 82 and 84.

After the coil is wound on a core it is inserted into the holder 12 such that the terminal leads 70, 72 and 74 extend through the central opening of the holder below the support member 26 and are positioned underneath the bottom peripheral edge extending across lead receiving areas 28, 30 and 34. The leads then extend upward along the outer surface of the vertical peripheral walls 14, 16 and 20 and extend across a series of recesses 86, 88, 90 and 92, formed in the top peripheral edge. The ends of the tapes are folded over across the recess areas and down the inside surface of the respective vertical walls 14, 16, 18 and 20 as shown.

The retainer frame 44 is then inserted over the coil so that the latches or latch fingers 56, 58, 60 and 62 extend into the latch sockets and latches the frame in place as shown in the partial view of FIG. 2. The holder assembly thus forms a simple and effective header for the respective leads of the coil. The leads are thus positioned for further bonding directly to a pad 94 on a PC board 96, as shown in FIG. 2.

The lower corner edges of the bottom peripheral surface of the holder is provided at each corner with a stand-off 98, as shown in FIG. 3, which serves to normally engage a surface of a PC board and support the lower surface away from the surface of a PC board. The standoffs are preferably about ten thousandths in height.

The holder and retainer are constructed of a suitable plastic material such as polyphysulphide (PPS), such as that sold under the trademark "Ryton". The foil windings preferably have a thickness on the order of about 4–5 thousandths with a 1 ml backing and about 2 or 3 ounce copper foil.

While I have illustrated and described my invention by means of specific embodiments, it is to be understood that numerous changes and modifications may be made therein without departing from the spirit and scope of the invention, as defined in the appended claims.

I claim:

1. A holder for surface mounting of an electrical component having a plurality of tape leads, comprising:
    a three dimensional rectangular frame having vertical peripheral walls formed of nonconducting material and forming a cavity for receiving an electrical component having a plurality of tape leads, said peripheral walls having a top peripheral edge and a bottom peripheral edge;
    support means on an inner surface of said walls for supporting the electrical component;
    a plurality of tape lead receiving areas formed in said bottom peripheral edge, said receiving areas each adapted for receiving and positioning one of said tape leads for direct engagement with and surface solder bonding at a respective one of said receiving areas with a solder pad of a conductor on a PC board; and
    a retainer engageable with an outer end of said one of said tape leads and latch means on said frame for retaining the electrical component and the outer end of said one of said tape leads in said cavity.

2. A holder according to claim 1 wherein said lead receiving areas comprise rounded portions of said bottom peripheral edge.

3. A holder according to claim 2 wherein said bottom peripheral edge includes standoff projections at each corner thereof.

4. A holder according to claim 3 wherein said top peripheral edge includes lead receiving recesses corresponding to said lead receiving areas.

5. A holder according to claim 1 further comprising the electrical component and wherein said electrical component is a coil formed of foil windings having tape leads formed by extensions of said foil windings, said leads having terminal ends.

6. A holder according to claim 5 wherein said lead receiving areas comprise rounded portions of said bottom peripheral edge.

7. A holder according to claim 5 wherein said leads extend outward from said frame across said lead receiving areas in said bottom peripheral edge to the exterior of said holder, up the outside one of said walls and over said top peripheral edge into said holder, and said retainer engages said terminal ends of said leads.

8. A holder according to claim 7 wherein said lead receiving areas lie in a common plane.

9. A holder according to claim 1 wherein said support means comprises a peripheral ledge extending inward from the interior of said vertical peripheral walls.

10. A holder according to claim 1 wherein said bottom peripheral edge includes standoff projections at each corner thereof.

11. An electrical component mounting holder for surface mounting of an electrical component having a plurality of tape leads, comprising:
    a non-conducting three dimensional rectangular frame having vertical peripheral walls formed of nonconducting material defining a cavity for receiving an electrical component having a plurality of tape leads, said peripheral walls having a top peripheral edge and a bottom peripheral edge;
    a support ledge extending inward from the inner surface of said peripheral walls for supporting the electrical component;
    a plurality of tape lead receiving areas formed in at least two sides of said bottom peripheral edge, said receiving areas each positioning one of said tape leads for surface bonding to a conductor on a PC board;
    a plurality of lead receiving recesses formed in corresponding sides of said top peripheral edge for receiving an outermost end of one of said tape leads positioned in one of said lead receiving areas in said bottom peripheral edge; and
    a retainer for mounting in engagement with latch means in said frame for retaining the electrical component and said outermost end of said one of said tape leads in said cavity.

12. A holder according to claim 11 further comprising an electrical component and wherein said electrical component is a coil formed of foil windings having leads formed by extensions of said foil windings, said leads having terminal ends.

13. A holder according to claim 12 wherein said leads extend outward from said frame across said lead receiving areas in said bottom peripheral edge to the exterior of said holder, up the outside one of said walls and over said top peripheral edge into said holder, and said retainer engages said terminal ends of said leads.

14. A holder according to claim 13 wherein said lead receiving areas comprise rounded portions of said bottom peripheral edge.

15. A holder according to claim 14 wherein said bottom peripheral edge includes standoff projections at each corner thereof.

16. An electrical component mounting holder for surface mounting of an electrical component having a plurality of tape leads, comprising:

- a non-conducting three dimensional rectangular frame having vertical peripheral walls formed of nonconducting material forming a cavity for receiving an electrical component having a plurality of tape leads, said peripheral walls having a top peripheral edge and a bottom peripheral edge;
- a support ledge extending inward from the inner surface of said peripheral walls for supporting an electrical component;
- a coil formed of foil windings having tape leads formed by extension of said foil windings, said leads having terminal ends;
- a plurality of tape lead receiving areas formed in at least two sides of said bottom peripheral edge, said receiving areas each positioning one of said tape leads for surface bonding to a conductor on a PC board;
- a plurality of lead receiving recesses formed in corresponding sides of said top peripheral edge for receiving an outermost end of said one of said tape leads; and
- a retainer for mounting in engagement with latch means in said frame for engaging and retaining the electrical component and said outermost end of said one of said tape leads in said cavity.

17. A holder according to claim 16 wherein said lead receiving areas are defined by rounded portions of said bottom peripheral edge.

18. A holder according to claim 17 wherein said leads extend outward from said frame across said lead receiving areas in said bottom peripheral edge to the exterior of said holder, up the outside one of said walls and over said upper peripheral edge into said holder, and said retainer engages said terminal ends of said leads.

19. A holder according to claim 18 wherein said bottom peripheral edge includes standoff projections at each corner thereof.

* * * * *